United States Patent [19]

Kao

[11] Patent Number: 5,781,140

[45] Date of Patent: Jul. 14, 1998

[54] TWO-SEGMENT LADDER CIRCUIT AND DIGITAL-TO-ANALOG CONVERTER

[75] Inventor: Hsueh-Wu Kao, Nan-Tou Hsien, Taiwan

[73] Assignee: Industrial Technology Research Institute, Hsinchu, Taiwan

[21] Appl. No.: 634,214

[22] Filed: Apr. 18, 1996

[51] Int. Cl.$^6$ .................................................. H03M 1/78
[52] U.S. Cl. ............................................. 341/154; 341/133
[58] Field of Search ............................... 341/154, 133

[56] References Cited

U.S. PATENT DOCUMENTS

| | | | |
|---|---|---|---|
| 3,728,719 | 4/1973 | Fish | 341/154 |
| 4,804,940 | 2/1989 | Takigawa et al. | 341/133 |
| 4,864,304 | 9/1989 | Shigehara et al. | 341/143 |
| 4,891,645 | 1/1990 | Lewis et al. | 341/154 |
| 5,119,095 | 6/1992 | Asazawa | 341/154 |
| 5,134,456 | 7/1992 | Kobatake | 357/41 |
| 5,212,484 | 5/1993 | Hillis | 341/154 |
| 5,691,721 | 11/1997 | Kim | 341/154 |

*Primary Examiner*—Marc S. Hoff
*Attorney, Agent, or Firm*—Cushman Darby & Cushman IP Group of Pillsbury Madison & Sutro LLP

[57] ABSTRACT

The two-segment ladder circuit disclosed comprises a front-end resistor for reducing a reference voltage to an internal voltage, a resistor network for receiving the internal voltage and generating a plurality of branch currents having magnitude that form a decreasing geometrical series with a ratio of 1/2, and a resistor for terminating the resistor network. The terminating resistor and resistors of the resistor network can be diffused resistors or well resistors, which require less chip area. In addition, the front-end resistor can be a polysilicon resistor, which is capable of withstanding the high reference voltage and has less resistance variation according to the voltage across it. The two-segment ladder circuit can be used as a building block for a digital-to-analog converters.

18 Claims, 3 Drawing Sheets

TWO-SEGMENT LADDER CIRCUIT AND DIGITAL-TO-ANALOG CONVERTER

BACKGROUND OF THE INVENTION

1. Field of the Invention

The present invention generally relates to a ladder circuit. More particularly, the present invention relates to a two-segment ladder circuit having two resistor segments that can be easily fabricated by prevalent equipment at a low fabrication cost. The two-segment ladder circuit according to the present invention can be used as a building block for digital-to-analog converters.

2. Description of Related Art

Ladder circuits fabricated in semiconductor chips are most widely used as building blocks for digital-to-analog converters. FIG. 1 (Prior Art) is a circuit diagram of a conventional ladder circuit, which comprises a resistor network 10 coupled at one end to a reference voltage $V_{ref}$ and at its other end to a terminating resistor $R_3'$. Resistor Network 10 comprises trunk resistors $R_1'$ and branch resistors $R_2'$, wherein the resistance value of branch resistors $R_2'$, given by $2R'$, is double that of trunk resistors $R_1'$, given by $R'$. At nodes 2', 4', 8', 16', 32', 64', 128', 256', the equivalent resistance value of the right-sided circuitry and that of the lower branch resistor $R_2$ are the same, given by $2R'$. These nodes can be therefore thought as points of equally dividing current. For example, the current $I_0'/2$ flowing into node 4' will be equally divided into the current $I_0'/4$ flowing through right-sided trunk resistor $R_1'$ and the current $I_0'/4$ flowing through lower branch resistor $R_2'$. Other nodes are similar to node 4'. Therefore, the branch currents flowing through the branch resistors $R_2'$ below nodes 2', 4', 8', 16', 32', 64', 128', 256' will be set as $I_0'/2$, $I_0'/4$, $I_0'/8$, $I_0'/16$, $I_0'/32$, $I_0'/64$, $I_0'/128$, $I_0'/256$, respectively. Magnitudes of all branch currents can represent the weighted values of all significant bits of a digital signal. Terminating resistor $R_3'$, which is used for impedance match and given by $2R'$, terminates the resistor network 10 at node 256'. In FIG. 1, all branch currents and the current flowing through the terminating resistor $R_3'$ can be collected to the ground GND to form a closed current loop. The equivalent resistance value of the ladder circuit is set to $R'$.

In a conventional ladder circuit the reference voltage $V_{ref}$ is relatively high, for example, in the range of 10 volts and 15 volts. Resistors of resistor network 10 must therefore be capable of withstanding this high reference voltage and have less voltage coefficient in order to maintain the accuracy of the branch currents. The occupied chip area of resistors of the ladder circuit is preferably small to save chip area. On the other hand, the resistance value of the resistors should be slightly larger to prevent varying during fabrication and application. These two requirements are contradictory to each other and therefore design compromise is necessary.

There are five well known types of semiconductor resistors:

1) diffused,
2) well,
3) polysilicon,
4) ion implant, and
5) thin-film.

The first type, the diffused resistor, is formed by diffusion regions and so can be formed simultaneously with the formation of sources/drains in a standard MOS process. The sheet resistance of a diffused resistor is slightly high and the voltage coefficient is close to that of polysilicon resistors.

Due to p-n junction characteristics, diffused resistors cannot withstand high voltage. For example, the substrate voltage generally is about Vdd volts. When the voltage applied to diffused resistors is higher than $Vdd+V_F$ volts, wherein $V_F$ is p-n junction forward bias voltage, the junction between both is forward-biased and so the resistor will not work.

The second type, the well resistor, is also formed by diffusion. The difference between diffused resistors and well resistors is mainly in doping concentration. The sheet resistance of a well resistor is the highest among the four types and so the required chip area is the smallest. Well resistors also have a relatively high voltage coefficient and can not withstand the high voltage since the p-n junction characteristics of well resistors are the same as those of diffused resistors.

The third type, the polysilicon resistor, is formed by lightly-doped or heavily-doped polysilicon and so can be formed simultaneously with the formation of polysilicon gates and other electrodes. Such a resistor is capable of withstanding a voltage within the range of the general reference voltage higher than $Vdd+V_F$ and has a much lower voltage coefficient than the second type of resistors. However, the polysilicon resistor has a smaller sheet resistance value and so will require more chip area. The above-described resistors can all be made simultaneously with some procedure of the conventional MOS process, thus keeping fabrication cost low.

The fourth type, the ion implant resistor, is formed by ion implant. The sheet resistance can be changed from several hundred-ohm to several kilo-ohm per square by using different doping concentration. The voltage coefficient of the ion implant resistor is also close to that of the polysilicon resistor. However, the ion implant resistor also has p-n junction characteristics so that it cannot withstand high reference voltage. In addition, fabrication of ion-implant resistors further includes a mask step, which cause additional cost.

The fifth type, the thin-film resistor, is made of metal such as tantalum (Ta), Nichrome (in-Cr), and Tin oxide ($SnO_2$). This resistor has excellent performance and can be used in many applications. Therefore, this is the most prevalent resistor type adopted by the DAC (digital-to-analog converter) manufacturer. Its drawback is that its fabrication must be done independent of the procedures carried out with respect to the conventional MOS process. Fabrication cost is therefore higher than the previously described resistor types. For manufacturers, using thin-film resistors requires the use of supplemental equipment and additional procedures over and above those required for standard fabrication processes, thereby increasing costs.

SUMMARY OF THE INVENTION

It is therefore an object of the present invention to provide a ladder circuit capable of withstanding high reference voltage, having less resistance variation according to the voltage across it, and requiring less chip area. The ladder circuit can preferably be made by existing equipment available for standard fabrication techniques to save production cost.

It is another object of the present invention to provide a digital-to-analog converter, whose performance is comparable to that of a conventional digital-to-analog converter.

The present invention achieves these objects by providing a two-segment ladder circuit, which comprises a front-end resistor for reducing a reference voltage to an internal voltage, a resistor network for receiving the internal voltage and generating a plurality of branch currents having magnitudes that form a decreasing geometrical series with a ratio of 1/2, and a resistor for terminating the resistor network. The terminating resistor and resistors of the resistor network can be diffused resistors or well resistors to reduce chip area. In addition, the front-end resistor can be a polysilicon resistor to increase the endurance of high reference voltage.

The present invention also provides a digital-to-analog converter for converting a digital input signal to an analog output signal, which comprises a front-end resistor for reducing a reference voltage to an internal voltage, a resistor network for receiving the internal voltage and generating a plurality of branch currents having magnitudes that form a geometrical series with a ratio of 1/2, a resistor for terminating the resistor network, and a plurality of switching arrangements for independently switching between a first output terminal and a second output terminal by the corresponding bits of the digital input signal, respectively. Each switching arrangement receives the corresponding branch current. The first output terminals of all the switching arrangements are connected together and used to output an aggregated current that is used to generate the analog output signal. The second output terminals of all the switching arrangements are tied to ground.

The digital-to-analog converter can further comprise a means for converting the aggregated current into an aggregated voltage that can also serve as the analog output signal. This converting means comprises an operation amplifier for providing a virtual ground for the aggregated voltage and a feedback resistor for transforming the aggregated current into the aggregated voltage. In addition, considering the conducting resistance of the switching arrangements, the resistance values of the switching arrangements form an increasing geometrical series with a ratio of 2 to compensate the branch currents, which form a decreasing geometrical series with a ratio of 1/2 as described above.

BRIEF DESCRIPTION OF THE DRAWINGS

The inventions will be described in further detail in specific presently preferred exemplary embodiments with reference to the accompanying drawings, wherein.

DETAILED DESCRIPTION OF THE PREFERRED EMBODIMENT

The two-segment ladder circuit according to the present invention combines the advantages of diffused/well resistors and polysilicon resistors to achieve the performance of a ladder circuit fabricated by thin-film resistors.

Figure 2:
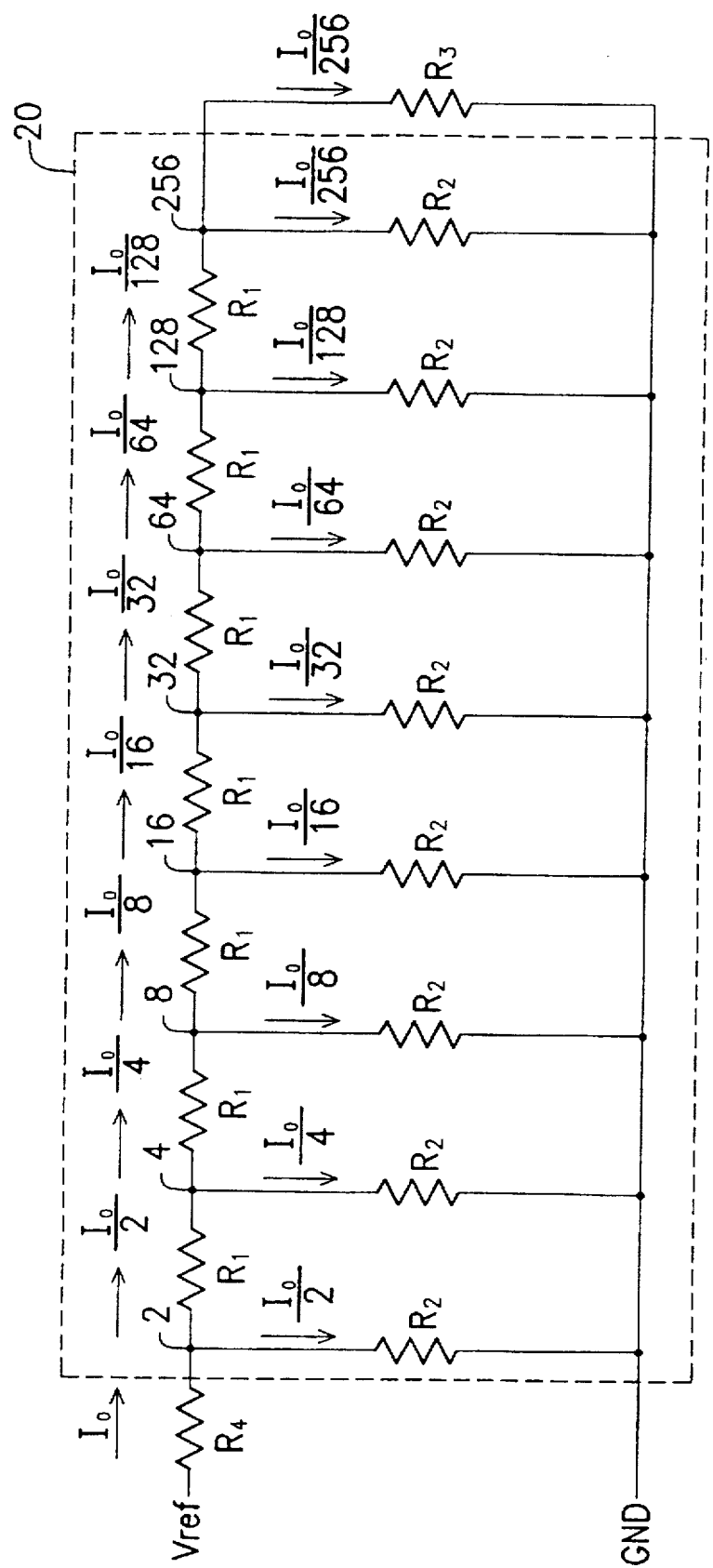
FIG. 2 is a circuit diagram of a two-segment ladder circuit according to the present invention.
Figure 3:
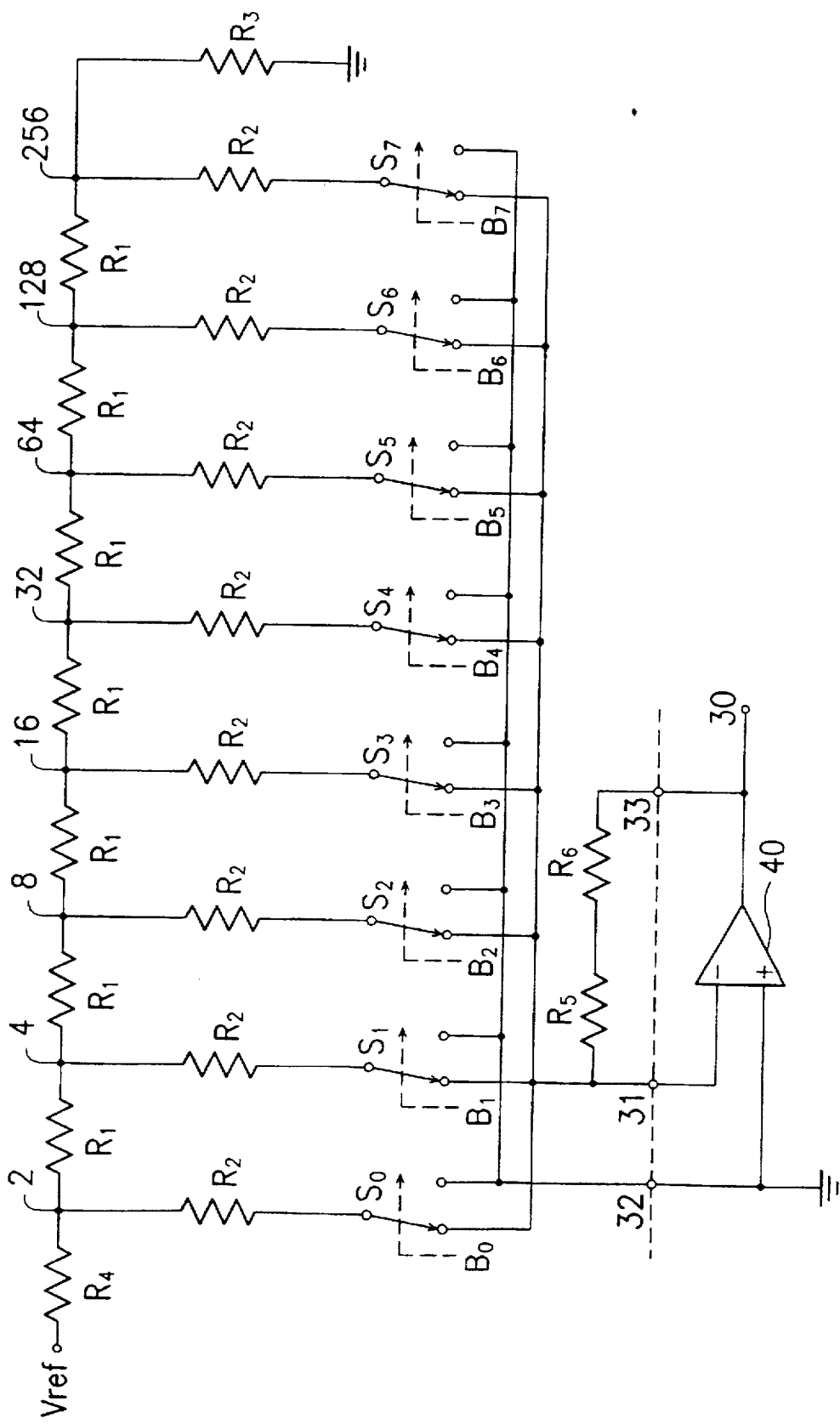
FIG. 3 is a circuit diagram of a digital-to-analog converter that comprises a two-segment ladder circuit according to the present invention.

FIG. 2 is a circuit diagram of a two-segment ladder circuit according to the present invention. FIG. 3 shows a digital-to-analog converter that comprises the two-segment ladder circuit according to the present invention. In this embodiment, the digital input signal is presumed to be 8-bit. However, the invention is not limited thereto. The principles of the invention can be applied to construct circuits for input signals of other bit lengths. The circuits can be appropriately configured and scaled accordingly.

Figure 1:
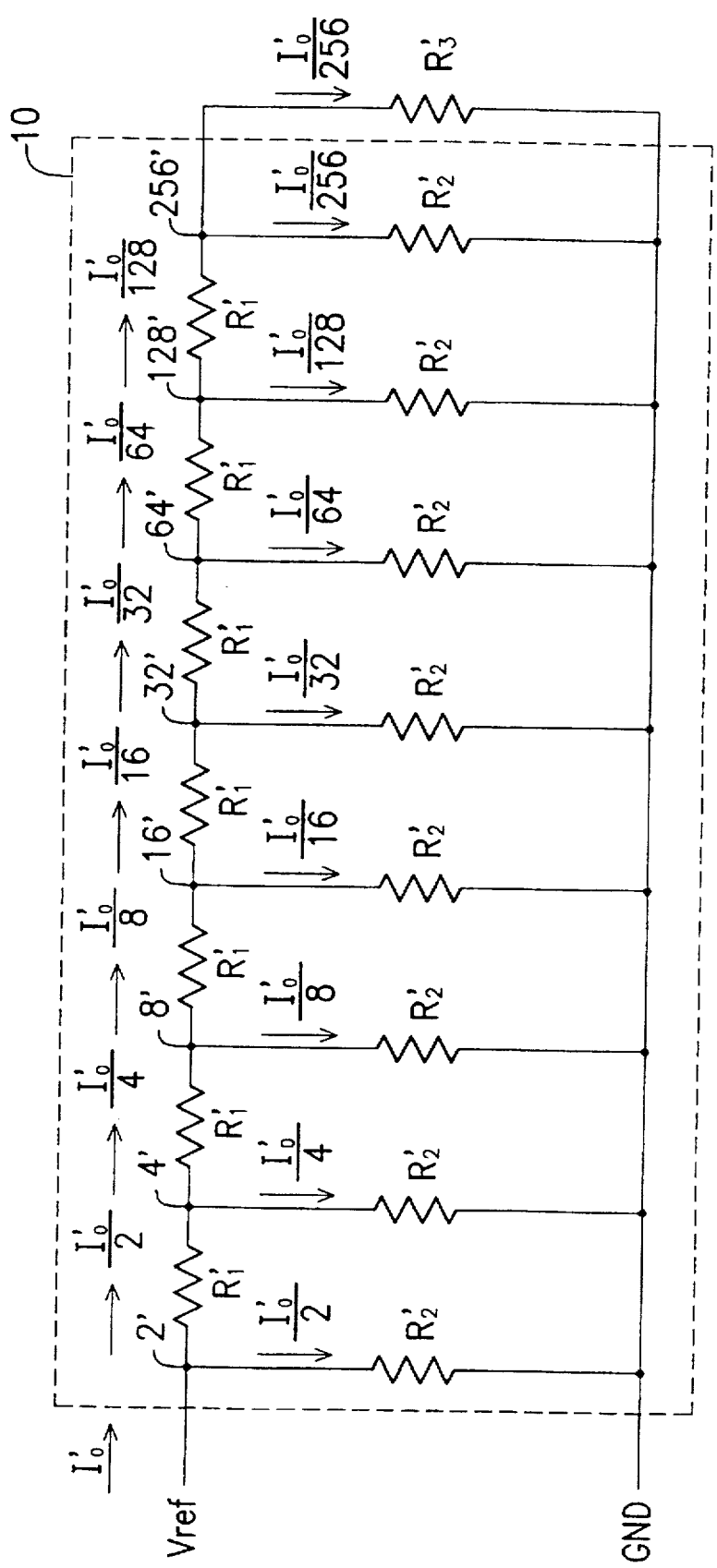
FIG. 1 (Prior Art) is a circuit diagram of the conventional ladder circuit.

The two-segment ladder circuit shown in FIG. 2 not only comprises a resistor network 20 and a terminating resistor RX, functionally like resistor network 10 and terminating resistor $R_3'$ in FIG. 1, but also includes a front-end resistor $R_4$ connected between network 20 and reference voltage $V_{ref}$. The resistance value of resistors $R_2$ and resistor $R_3$, given by 2R, is also double that of resistor $R_1$, given by R. Considering the right-sided circuitry of node 2, the electrical property should be the same as the conventional case. Therefore, the branch currents flowing through the branch resistors $R_2$ at nodes 2, 4, 8, 16, 32, 64, 128, 256 will be respectively set as $I_0/2$, $I_0/4$ $I_0/8$, $I_0/16$, $I_0/32$, $I_0/64$, $I_0/128$, $I_0/256$, which form a decreasing geometrical series with a ratio of 1/2. Front-end resistor $R_4$ is used for reducing the reference voltage $V_{ref}$ into an internal voltage at node 2, which is much lower than that of node 2' in the FIG. 1. Such lower internal voltage at node 2 will not apparently affect performance of resistors $R_1$, $R_2$, and $R_3$ even if these resistors are not made of thin-film metal. Therefore, in this embodiment, resistors $R_1$, $R_2$, $R_3$ preferably are diffused resistors or well resistors. Diffused or well resistors have a relatively high sheet resistance value, on the order of several hundred-ohm to several kilo-ohm per square, so the chip area occupied by these resistors can be reduced. On the other hand, front-end resistor $R_4$ is capable of withstanding the high voltage and does not waste much chip area. Therefore, in this embodiment, resistor $R_4$ is preferably fabricated as a polysilicon resistor. Using this approach, the circuit performance and the chip area can both be optimized.

A practical example of this embodiment will be used to explain the two-segment ladder circuit arrangement of the present invention compared with that of a conventional ladder circuit arrangement. Suppose that the reference voltage is 10 volts, which is typical for a conventional ladder circuit. In addition, assume that the resistance value of resistor $R_4$ is 8.5 kΩ, $R_1$ is 1.5 kΩ, and $R_2$ and $R_3$, are 3.0 kΩ. The resistance value of $R_2$ still is double that of $R_1$. The equivalent resistance value of the right-sided circuitry of resistor $R_4$ therefore will be 1.5 kΩ. From the Ohm's law, the current $I_0$ flowing through resistor $R_4$ will be 10V/(8.5 kΩ+1.5 kΩ)=1 mA. The voltage at node 2 is 1.5 volts and the others at succeeding nodes will be lowered into halves consecutively. The resistance value of polysilicon resistor $R_4$, which has less voltage coefficient and no forward-bias problem, varies minutely while the voltage across the resistor is 8.5 volts. On the other hand, the resistance value of diffused or well resistors $R_1$, $R_2$, and $R_3$ will also vary minutely due mainly to the lower voltage across the resistor (lower than 1.5 volts). Forward-biasing between the substrate and the resistor regions will not occur. The occupied chip area can be effectively reduced because the resistance value is reduced from 10 kΩ to 1.5 kΩ. While designing the layout of a resistor network, the width of each resistor remains quite large for the matching of the whole resistor network. The length of each resistor can be shortened when the resistance value is reduced. Therefore, the chip area occupied by the resistor network is reduced. This effect can compensate the increase of switch size.

All resistors shown in FIG. 2 can be arranged and fabricated with practical layouts in the form of several resistor segments. As an alternative to connecting to ground GND, resistors $R_2$ and $R_3$ could be connected to a fixed voltage. In such a situation, the proportion relation between the branch currents still can be maintained.

A digital-to-analog converter according to the present invention is shown in FIG. 3. In addition to the ladder circuit elements described above, the digital-to-analog converter also comprises switching devices $S_0$ to $S_7$, feedback resistors $R_5$ and $R_6$, and an operational amplifier 40. Each switching device has a first output terminal (left in FIG. 3) and a second output terminal (right in FIG. 3). The switch position is controlled by the corresponding significant bit, one of bits $B_0$ to $B_7$, of a digital input signal required to be converted. If the corresponding bit is "1", the switching device will be switched to the first output terminal. Otherwise, if the corresponding significant bit is "0", the switching device will be switched to the second output terminal. In this embodiment the most significant bit is $B_0$ and the least significant bit is $B_7$. However, the circuit arrangement could be made to be the reverse as well. The switching devices switched to the first output terminals will conduct the corresponding branch currents into node 31. An aggregated current flowing at node 31 then serves as an analog output signal corresponding to the digital input signal or can be used to generate an analog output signal. The second output terminals of switching devices $S_0$ to $S_7$ are connected to node 32, which is connected to the ground GND in this embodiment. The feedback resistors $R_5$ and $R_6$ and operational amplifier 40 serve as a converting device and are used for converting the aggregated current at node 31 into an aggregated voltage corresponding to the digital input signal. Nodes 31, 32, and 33 generally serve as output pins of a commercial IC product. This means that the feedback resistors $R_5$ and $R_6$ are fabricated into a semiconductor chip but operational amplifier 40 is an external device. However, the present invention should not be limited within such a situation. Arranging the feedback resistors as the exterior or the operational amplifier as the interior will also meet the requirement of the present invention. In this embodiment, resistor $R_5$ is a diffused or well resistor and $R_6$ is a polysilicon resistor, the same as the resistor network. Such arrangement can avoid the high-voltage problem, such as resistance variation and forward-biasing, that may happen at node 33. In addition, this arrangement can achieve good matching for the resistor network. Operational amplifier 40 enables node 31 as virtual ground for the voltage at node 30, same as that of node 33 in this embodiment. The aggregated voltage at node 30 will be proportional to the aggregated current and the ratio of them is the resistance value of feedback resistors $R_5$ and $R_6$. In addition, the resistance values of resistors $R_5$ and $R_6$ can be 1.5 k$\Omega$ and 8.5 k$\Omega$, which are the same as that of $R_4$ and $R_1$, respectively, to facilitate the fabrication process.

When the conducting resistance of switching devices $S_0$ to $S_7$, is large enough and then should be seriously considered, the conducting resistance must be previously controlled to prevent from changing the ratio relation between resistors of the ladder circuit 20. Note that the branch currents will keep the ratio relation if the voltages of joints of resistors $R_2$ and switching means $S_0$ to $S_7$ maintains the same. Therefore, the conducting resistance values of all the switching devices are so arranged that the voltage drops of switching means $S_0$ to $S_7$ will be the same. That is, the resistance values of the switching means form an increasing geometrical series with a ratio of 2, which is inversely proportional to the branch currents that form a decreasing geometrical series with a ratio of 1/2. Then the precision of digital-to-analog converting can be maintained.

Advantages of the two-segment ladder circuit and the digital-to-analog converter of the present invention can be described as follows:

1. No extra fabrication procedures are required to form these resistors. Diffused (well) resistors can be made simultaneously with the formation of the source/drain (well) regions in the prevalent MOS process. Polysilicon resistors can be made in parallel with the formation of polysilicon gates or other electrodes. In addition, no extra equipment, like thin-film resistor equipment, is necessary. Such an advantage can reduce the product cost and facilitate the process.

2. There is a compromise between the chip area and the circuit performance. Diffused or well resistors, used as resistors of the resistor network, occupy less chip area. Polysilicon resistors, used as the front-end resistor, can promote the capability of withstanding the high voltage and attenuate the effect of voltage coefficient.

What is claimed is:

1. A two-segment ladder integrated circuit, comprising:

a front-end resistor forming a first segment for reducing a reference voltage to an internal voltage, the front-end resistor being made from a first semiconductor material type;

a resistor network including a plurality of resistors receiving the internal voltage and generating a plurality of branch currents having magnitudes that form terms of a geometrical series with a common ratio of 1/2, wherein the plurality of resistors of the resistor network are made from a second semiconductor material type different from the first semiconductor material type; and a terminating resistor for terminating the resistor network, wherein the resistor network and the terminating resistor form a second segment.

2. A two-segment ladder circuit as recited in claim 1, wherein the terminating resistor and the plurality of resistors of the resistor network are diffused resistors.

3. A two-segment ladder circuit as recited in claim 2, wherein the front-end resistor is a polysilicon resistor.

4. A two-segment ladder circuit as recited in claim 1, wherein the terminating resistor and the plurality of resistors of the resistor network are well resistors.

5. A two-segment ladder circuit as recited in claim 4, wherein the front-end resistor is a polysilicon resistor.

6. A two-segment ladder circuit as recited in claim 1, wherein the front-end resistor is a polysilicon resistor.

7. An integrated digital-to-analog converter for converting a digital input signal having a plurality of bits to an analog output signal, comprising:

a front-end resistor for reducing a reference voltage to an internal voltage, the front-end resistor being made from a first semiconductor material type;

a resistor network including a plurality of resistors receiving the internal voltage and generating a plurality of branch currents having magnitudes that form terms of a geometrical series with a common ratio of 1/2 from branch to branch, wherein the plurality of resistors of the resistor network are made of a second semiconductor material type different from the first semiconductor material type;

a terminating resistor for terminating the resistor network; and a plurality of independent switching arrangements, each switching arrangement including an input terminal, a first output terminal and a second output terminal, wherein each switching arrangement receives a corresponding one of the plurality of branch currents at its respective input terminal and is controlled by a corresponding one of the plurality of bits of the digital input signal, each switching arrangement switches its input branch current between said first and said second output terminals depending upon the controlling bit of the digital input signal, the first output terminals of all of the switching arrangements are connected together to provide an aggregated output current forming the analog output signal, and the second output terminals of all switching arrangements are connected together to a second reference voltage.

8. A digital-to-analog converter as recited in claim 7, further comprising:

means for converting the aggregated current to an aggregated voltage that serves as the analog output signal.

9. A digital-to-analog converter as recited in claim 8, wherein the converting means comprises:

an operational amplifier for providing a virtual ground for the aggregated voltage; and a feedback resistor for transforming the aggregated current into the aggregated voltage.

10. A digital-to-analog converter as recited in claim 9, wherein the operational amplifier is an external device.

11. A digital-to-analog converter as recited in claim 9, wherein the feedback resistor comprises a diffused resistor and a polysilicon resistor.

12. A digital-to-analog converter as recited in claim 9, wherein the feedback resistor comprises a well resistor and a polysilicon resistor.

13. A digital-to-analog converter as recited in claim 8, wherein the terminating resistor and the plurality of resistors of the resistor network are diffused resistors.

14. A digital-to-analog converter as recited in claim 13, wherein the front-end resistor is a polysilicon resistor.

15. A digital-to-analog converter as recited in claim 8, wherein the terminating resistor and the plurality of resistors of the resistor network are well resistors.

16. A digital-to-analog converter as recited in claim 15, wherein the front-end resistor is a polysilicon resistor.

17. A digital-to-analog converter as recited in claim 7, wherein the front-end resistor is a polysilicon resistor.

18. A digital-to-analog converter as recited in claim 7, wherein the plurality of independent switching arrangements having resistance values that form terms of a geometrical series with a common ratio of 2.

* * * * *